(12) United States Patent
Han et al.

(10) Patent No.: US 7,431,855 B2
(45) Date of Patent: Oct. 7, 2008

(54) APPARATUS AND METHOD FOR REMOVING PHOTORESIST FROM A SUBSTRATE

(75) Inventors: Donggyun Han, Yongin-si (KR); Woosung Han, Seoul (KR); Changki Hong, Seongnam-si (KR); Sangjun Choi, Seoul (KR); Hyungho Ko, Seoul (KR); Hyosan Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 54 days.

(21) Appl. No.: 10/712,775

(22) Filed: Nov. 14, 2003

(65) Prior Publication Data
US 2004/0266205 A1    Dec. 30, 2004

(30) Foreign Application Priority Data
Jun. 26, 2003  (KR)  .................. 10-2003-0042133

(51) Int. Cl.
*H01L 21/3105* (2006.01)
(52) U.S. Cl. .............................. 216/57; 216/58; 216/62; 216/83; 438/704; 438/725; 438/734; 438/906
(58) Field of Classification Search .................. None
See application file for complete search history.

(56) References Cited

U.S. PATENT DOCUMENTS

| | | | |
|---|---|---|---|
| 5,908,510 A | 6/1999 | McCullough et al. | |
| 6,306,564 B1 * | 10/2001 | Mullee | 430/329 |
| 6,500,605 B1 | 12/2002 | Mullee et al. | |
| 6,509,141 B2 | 1/2003 | Mullee | |
| 6,558,477 B1 | 5/2003 | Scovell | |
| 6,715,498 B1 * | 4/2004 | Humayun et al. | 134/1.3 |
| 6,764,552 B1 * | 7/2004 | Joyce et al. | 134/3 |
| 6,770,426 B1 * | 8/2004 | Vaartstra | 430/331 |
| 6,800,142 B1 * | 10/2004 | Tipton et al. | 134/26 |
| 6,871,656 B2 * | 3/2005 | Mullee | 134/103.1 |
| 6,926,012 B2 * | 8/2005 | Biberger et al. | 134/1.3 |
| 7,060,422 B2 * | 6/2006 | Biberger et al. | 430/329 |
| 2002/0014257 A1 * | 2/2002 | Chandra et al. | 134/19 |

(Continued)

FOREIGN PATENT DOCUMENTS

WO    WO 02/11191 A2    2/2002

(Continued)

OTHER PUBLICATIONS

Liu, F. et al "Use of phosphorus-31 (1+) for mask fabrication" Bandaoti Xuebao, 1984, 5(5) 573-6.*

(Continued)

*Primary Examiner*—Anita K Alanko
(74) *Attorney, Agent, or Firm*—Harness, Dickey & Pierce, P.L.C.

(57) ABSTRACT

An apparatus and method for removing photoresist from a substrate, which includes treating the photoresist with a first reactant to cause swelling, cracking or delamination of the photoresist, treating the photoresist with a second reactant to chemically alter the photoresist, and subsequently removing the chemically altered photoresist with a third reactant. In one example, the first reactant is supercritical carbon dioxide (SCCO$_2$), the second reactant is ozone vapor, and the third reactant is deionized water.

36 Claims, 11 Drawing Sheets

U.S. PATENT DOCUMENTS

| | | |
|---|---|---|
| 2002/0134409 A1 | 9/2002 | Scovell |
| 2002/0179126 A1* | 12/2002 | DeYoung et al. ............... 134/36 |
| 2003/0045117 A1 | 3/2003 | Cotte et al. |
| 2004/0198627 A1* | 10/2004 | Masuda et al. ............... 510/412 |
| 2006/0081273 A1* | 4/2006 | McDermott et al. ............ 134/26 |
| 2006/0102204 A1* | 5/2006 | Jacobson et al. ............... 134/26 |
| 2006/0102208 A1* | 5/2006 | Jacobson et al. ........... 134/56 R |
| 2006/0102590 A1* | 5/2006 | Kevwitch et al. ............... 216/83 |

FOREIGN PATENT DOCUMENTS

WO     WO 200211191 A2 * 2/2002

OTHER PUBLICATIONS

Shibata, K. et al "Improvement of dry etching resistance of photoresist by means of ion implantation" IEIC Technical Report, 1995, vol. 95, No. 206, pp. 51-57.*

English Translation of German Office Action dated Dec. 7, 2005 for German Application No. 10 2004 029 077.6-51.

* cited by examiner

APPARATUS AND METHOD FOR REMOVING PHOTORESIST FROM A SUBSTRATE

BACKGROUND OF THE INVENTION

Photoresist is an organic polymer which becomes soluble when exposed to light. Photoresist is used in many applications within various industries, such as the semiconductor, biomedical engineering, holographic, electronics, and nanofabrication industries. As an example, photoresist is used to help define circuit patterns during chip fabrication in the semiconductor industry. The use of photoresist prevents etching or plating in the area the photoresist covers (this is also know as resist).

The removal of photoresist, commonly known as "stripping" is preceded by plasma ashing, etching, or other manufacturing steps. These steps can degrade or carbonize the photoresist and leave a photoresist reside that is difficult to remove by current stripping methods. In particular, ion implantation with a dose of $3 \times 10^{15}$ ions/cm$^2$ or higher creates a photoresist exhibiting a hard outer crust covering a soft core. FIG. 1A illustrates a cross-sectional view and FIG. 1B illustrates a top view of a photoresist exhibiting a hard outer crust 40' caused by ion implantation. As illustrated in FIGS. 1A and 1B, the hard outer 40' crust may be on the order of 200 to 300 Å thick.

FIG. 2 is a cross-sectional view illustrating the ion implantation step. FIG. 2 illustrates a substrate 110, a gate electrode 10, an insulation film 11, and n-region of a source/drain region 20, a spacer 30, a photoresist pattern 40, and a well 50. When the photoresist pattern 40 is exposed to ion implantation 45, a hard outer crust 40' is formed on the photoresist pattern 40.

Residue may also be a problem. FIG. 3A illustrates a cross-section view and FIG. 3B illustrates a top view of a photoresist exhibiting residue after an etching process or a chemical mechanical polishing (CMP) process. FIG. 3A illustrates a substrate 110, an etched player 60, a photoresist pattern 70, and a hard outer crust 70', which is formed when the photoresist pattern 70 is exposed to ion implantation 75, FIGS. 3A and 3B illustrate residue 80 and an organic defect 90.

Conventionally, photoresist has been removed by a plasma ashing process followed by a stripping process. The plasma ashing process utilizes $O_2$ plasma which may cause damage to the sublayer and thereby degrade the electrical performance of the underlying semiconductor device. The stripping process requires high quantities of toxic and/or corrosive chemicals to remove photoreactive polomers or photoresist from chip surfaces.

In order to overcome these problems, other stripping methods have been developed including organic and/or inorganic stripping solvents with supercritical carbon dioxide (SCCO$_2$) or ozone (O$_3$) gas. Techniques which remove resist using SCCO$_2$ utilize a densified CO$_2$ cleaning composition which includes CO$_2$ and at least one cosolvent such as a surfactant, alcohol, or amine. However, the methods utilizing SCCO$_2$ and a cosolvent are incapable of dissolving a hard outer crust of a photoresist caused by ion implantation.

A second method for removing photoresist or other organic material from a substrate such as a semiconductor wafer includes partially immersing the substrate in a solvent, for example, deionized water, in a reaction chamber, injecting an oxidizing gas, for example, ozone, into the reaction chamber and rotating or otherwise moving the substrate through the solvent to coat a thick film of solvent over the organic component on the substrate surface and expose the solvent-coated component to the ozone gas to remove the organic material from the surface. Again, the resist removal techniques utilizing ozone are incapable of dissolving a hard outer crust caused by an ion implantation step. FIG. 4 illustrates a failure of a resist removal techniques using ozone to remove a hard outer crust of the photoresist caused by ion implantation with a dose of $3 \times 10^{15}$ ions/cm$^2$ or higher.

SUMMARY OF THE INVENTION

In exemplary embodiments, the present invention is directed to a method of removing photoresist from a substrate, which includes treating the photoresist with a first reactant to cause swelling, cracking or delamination of the photoresist, treating the photoresist with a second reactant to chemically alter the photoresist, and subsequently removing the chemically altered photoresist with a third reactant.

In exemplary embodiments, the present invention is directed to a method of removing photoresist from a substrate, which includes treating the photoresist with supercritical carbon dioxide (SCCO$_2$), treating the photoresist with an ozone-based reactant, and removing the photoresist with deionized water.

In exemplary embodiments, the present invention is directed to a method of removing photoresist from a substrate, which includes loading the substrate into a chamber, injecting a first reactant into the chamber and converting the first reactant to supercritical condition, maintaining contact between the substrate and the supercritical first reactant, depressurizing the chamber, injecting a second reactant into the chamber, maintaining contact between the substrate and the second reactant, purging the chamber and unloading the substrate, removing the photoresist, and drying the substrate.

In exemplary embodiments, the present invention is directed to an apparatus for removing photoresist from a substrate, which includes at least one chamber for treating the photoresist with a first reactant to cause swelling, cracking or delamination of the photoresist, for treating the photoresist with a second reactant to chemically alter the photoresist, for rinsing the substrate, for drying the substrate and for holding the substrate and a transfer device for transferring the substrate between chambers.

In exemplary embodiments, the present invention may also be used to remove normal photoresist in addition to the hard outer crust. Still further, exemplary embodiments of the present invention do not damage the underlying photoresist. Still further, exemplary embodiments of the present invention do not use organic contaminants or leave an organic residue.

BRIEF DESCRIPTION OF THE DRAWINGS

The present invention will become more fully understood from the detailed description given below and the accompanying drawings, which are given for purposes of illustration only, and thus do not limit the invention.

DETAILED DESCRIPTION OF THE EXEMPLARY EMBODIMENTS

Figure 1A:
FIG. 1A illustrates a cross-sectional view and FIG. 1B illustrates a top view of a photoresist exhibiting a hard outer crust 40' caused by ion implantation.
Figure 1B:
Figure 2:
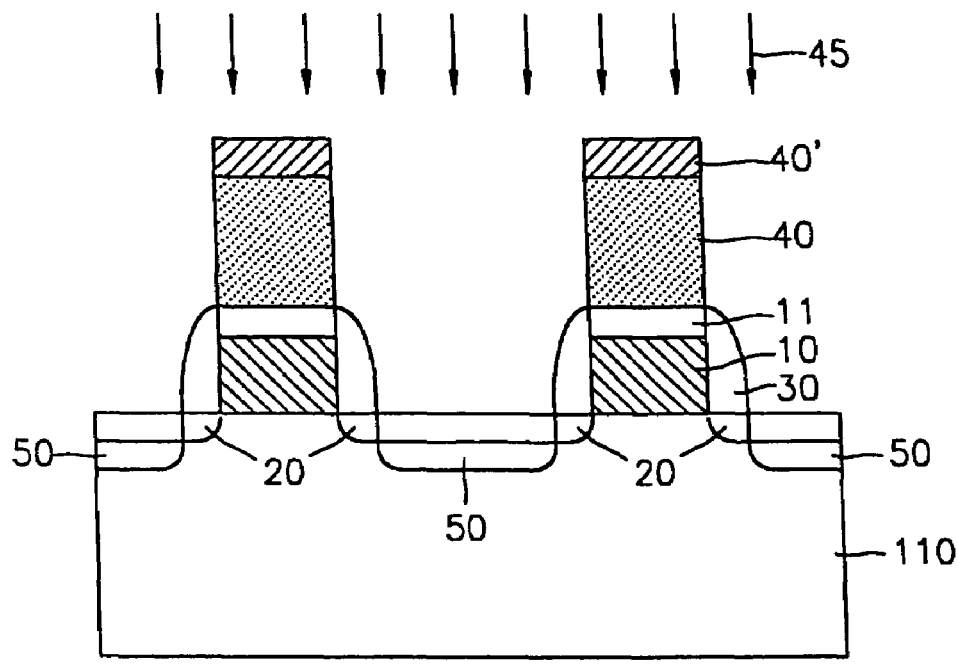
FIG. 2 is a cross-sectional view illustrating a conventional ion implantation step.
Figure 3A:
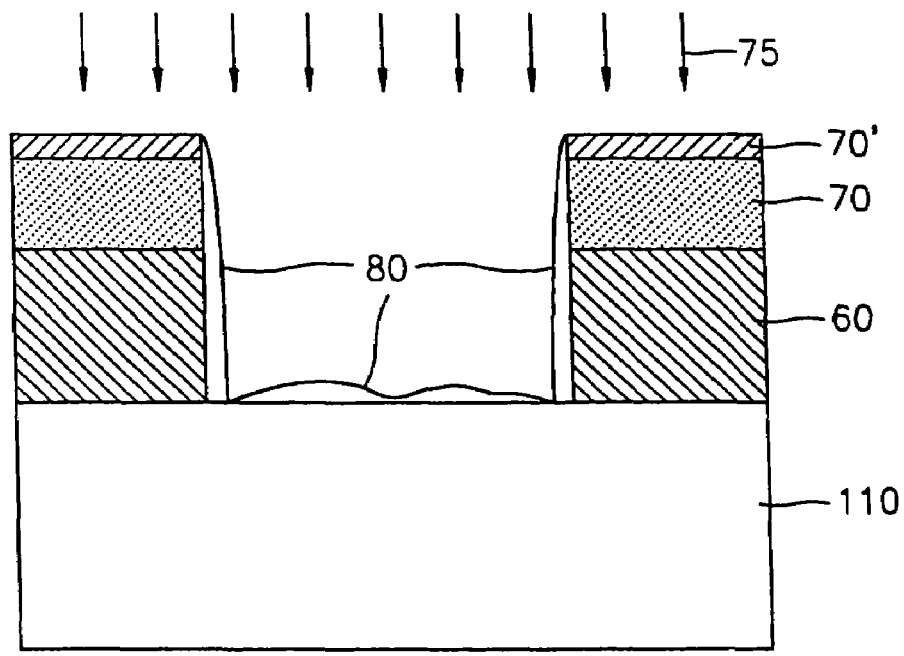
FIG. 3A illustrates a cross-section view and FIG. 3B illustrates a top view of a photoresist exhibiting residue after a conventional etching process or a conventional chemical mechanical polishing (CMP) process.
Figure 3B:
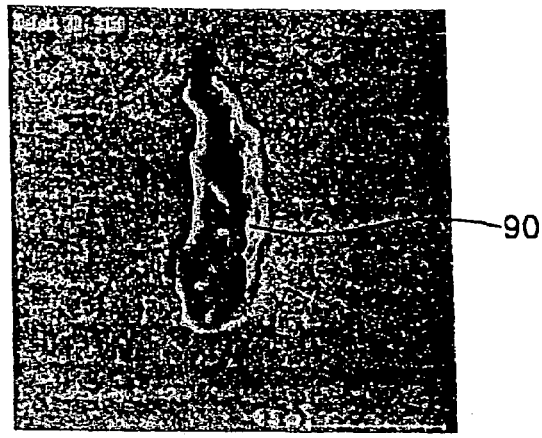
Figure 4:
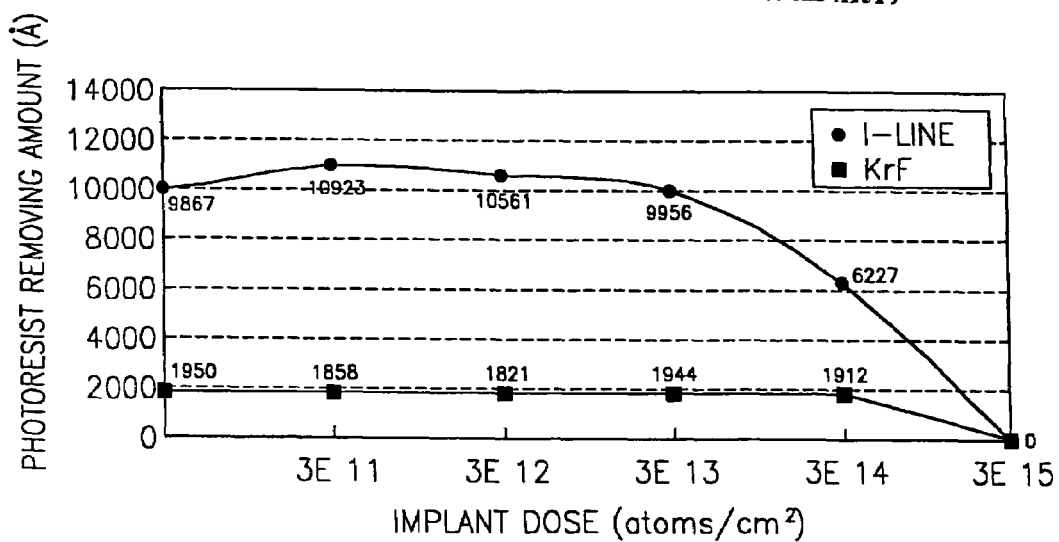
FIG. 4 illustrates the failure of conventional resist removal techniques using ozone to remove a hard outer crust of the photoresist caused by ion implantation with a dose of $3 \times 10^{15}$ ions/cm$^2$ or higher.
Figure 5:
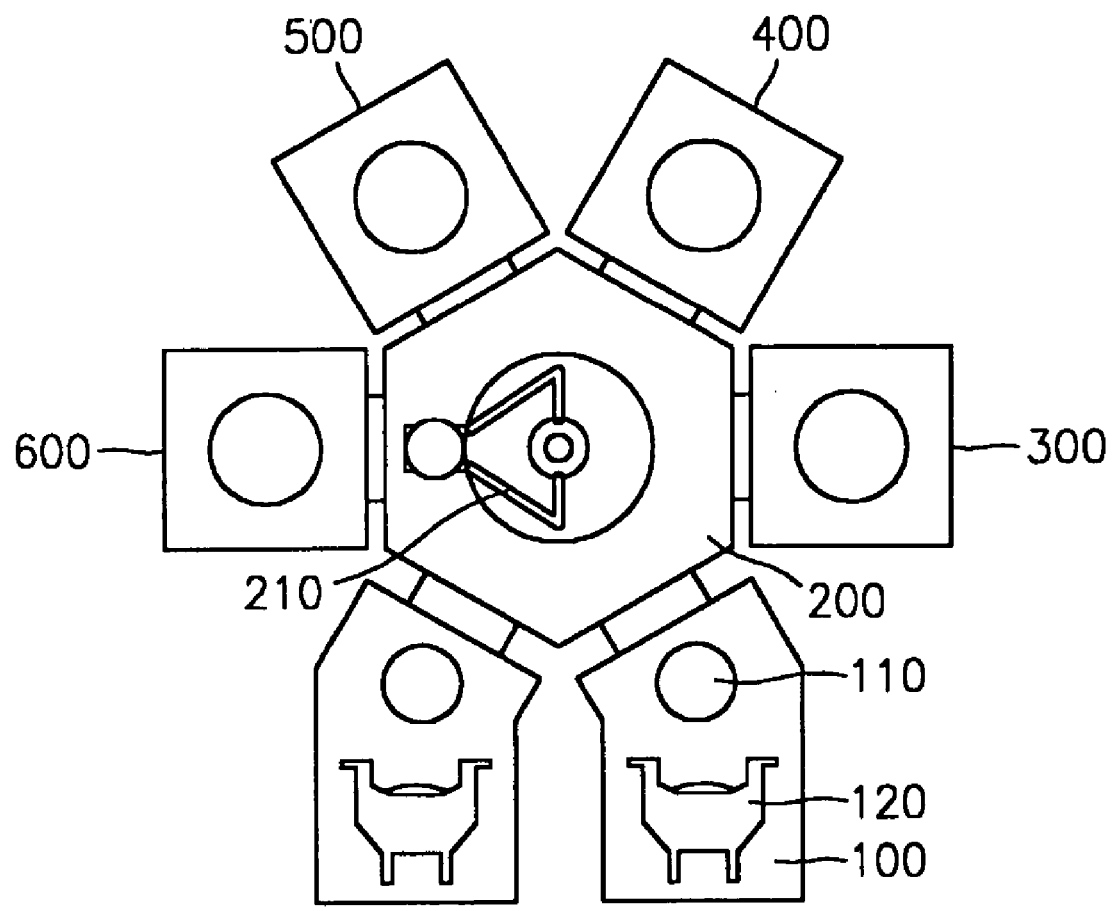
FIG. 5 illustrates an apparatus for removing photoresist from a substrate in accordance with an exemplary embodiment of the present invention.

FIG. 5 illustrates an apparatus for removing photoresist from a substrate in accordance with an exemplary embodiment of the present invention. As illustrated in FIG. 5, the apparatus includes at least one chamber 100. At least one substrate is provided in at least one chamber 100. The substrate 110 may be provided via a cassette 120. The apparatus may also include a transfer chamber 200, an $SCCO_2$ treatment chamber 300, an ozone vapor treatment chamber 400, a rinse (or bath) chamber 500, and drying chamber 600. The substrate 110 may be moved from chambers 100 to 600 via a mechanical or electromechanical device, such as robotic arm 210.

Figure 6:
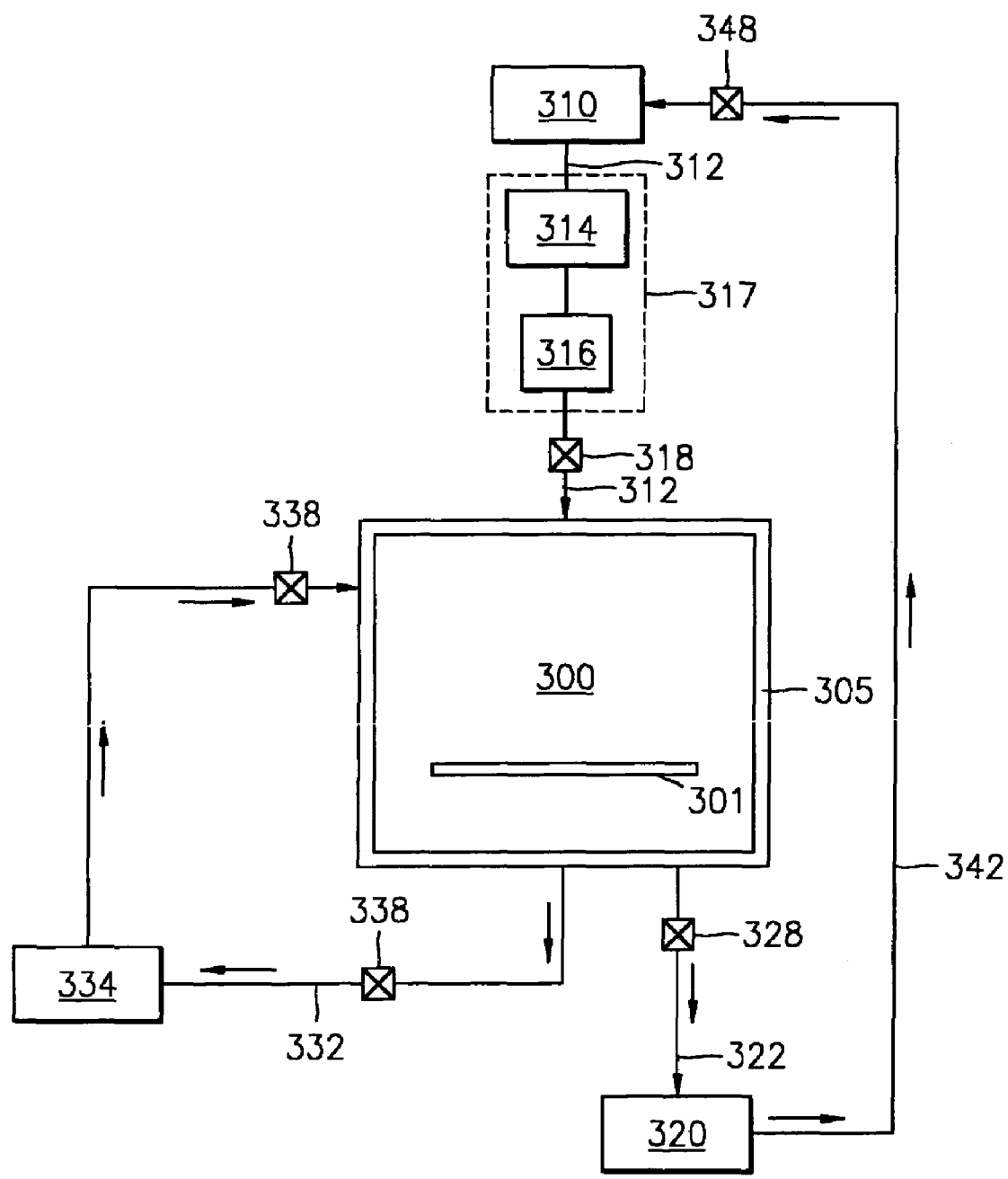
FIG. 6 illustrates an $SCCO_2$ treatment chamber of FIG. 1 and associated elements in accordance with an exemplary embodiment of the present invention.

FIG. 6 illustrates the $SCCO_2$ treatment chamber 300 of FIG. 5 and associated elements in accordance with an exemplary embodiment of the present invention. FIG. 6 illustrates the $SCCO_2$ treatment chamber 300, a wafer plate 301, a heater jacket 305, a $CO_2$ cylinder 310, a $CO_2$ inlet conduit 312, a $CO_2$ pressure pump 314, and a $CO_2$ heater 316. FIG. 6 also illustrates an $SCCO_2$ generator 317, one or more $CO_2$ control valves 318, 328, 338, 348, an exhausted $CO_2$ reservoir 320, an exhausted $CO_2$ outlet conduit 322, a circulation conduit 332, a circulation pump 334, and a $CO_2$ return 342.

Figure 7:
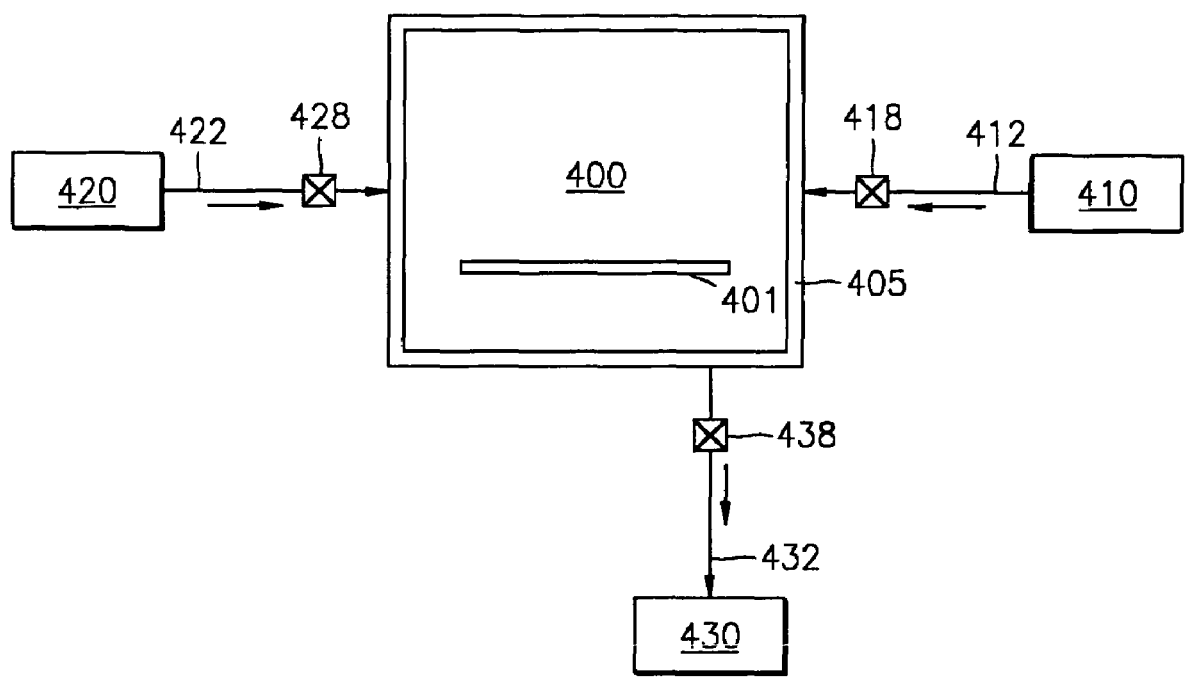
FIG. 7 illustrates the ozone vapor treatment chamber of FIG. 5 in an exemplary embodiment of the present invention.

FIG. 7 illustrates the ozone vapor treatment chamber 400 of FIG. 5 in an exemplary embodiment of the present invention. FIG. 7 illustrates the ozone vapor treatment chamber 400, a wafer plate 401, a heater jacket 405, an ozone gas generator 410, an ozone gas inlet conduit 412, and an ozone control valve 418. FIG. 7 further illustrates a vapor generator 420, a vapor inlet conduit 422, and a vapor control valve 428. The ozone vapor treatment chamber 400 further includes an exhausted gas reservoir 430, an exhausted gas outlet conduit 432, and an exhausted gas control valve 438.

Figure 8A:
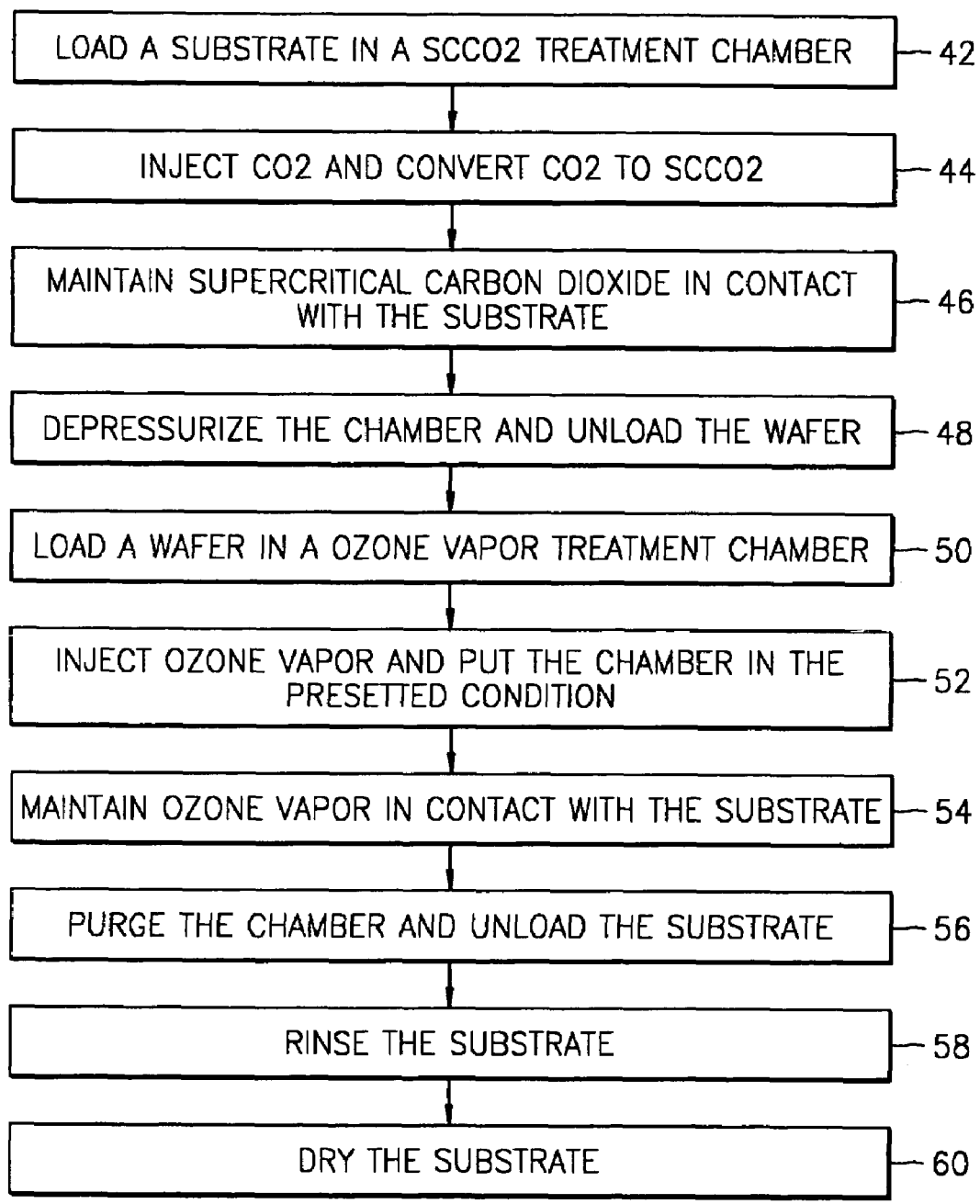
FIG. 8A illustrates a flow chart of an exemplary method of the present invention and FIG. 8B illustrates an exemplary pressure versus time graph for the flowchart of FIG. 8A.
Figure 8B:
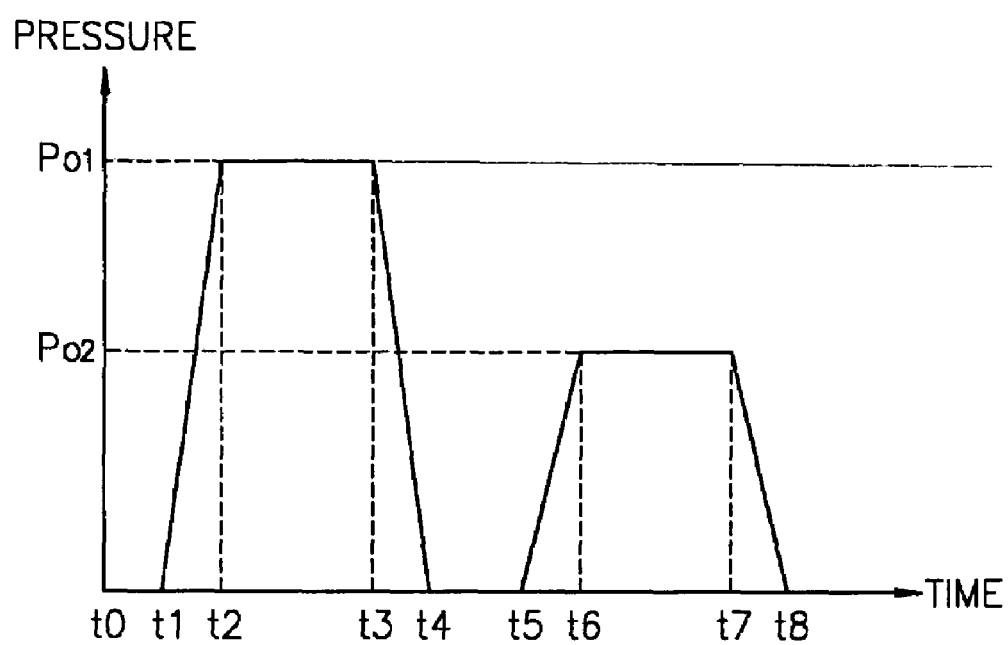

FIG. 8A illustrates a flow chart of an exemplary method of the present invention and FIG. 8B illustrates a pressure versus time graph for the flowchart of FIG. 8A. At step 42, a substrate 110 is loaded in the $SCCO_2$ treatment chamber 300. At step 44, $CO_2$ is injected into the $SCCO_2$ treatment chamber 300 and $CO_2$ is converted to $SCCO_2$. At step 46, the $SCCO_2$ is maintained in contact with the substrate 110. At step 48, the $SCCO_2$ treatment chamber 300 is depressurized and the wafer 110 is removed. At step 50, the substrate 110 is loaded into the ozone vapor treatment chamber 400 and at step 50, ozone vapor is injected into the ozone vapor treatment 400 under desired conditions. At step 54, the ozone vapor is maintained in contact with the substrate 110. In step 56, the ozone vapor chamber 400 is purged and the substrate 110 is removed. At step 58, the substrate 110 is moved to a rinse or bath chamber 500 for rinsing and at step 60, the substrate 110 is moved to the drying chamber 600 for drying.

Although FIG. 5 of the present application illustrates a multi-chamber apparatus, the teachings of the present invention may also be applied to a monolithic chamber apparatus.

Figure 9A:
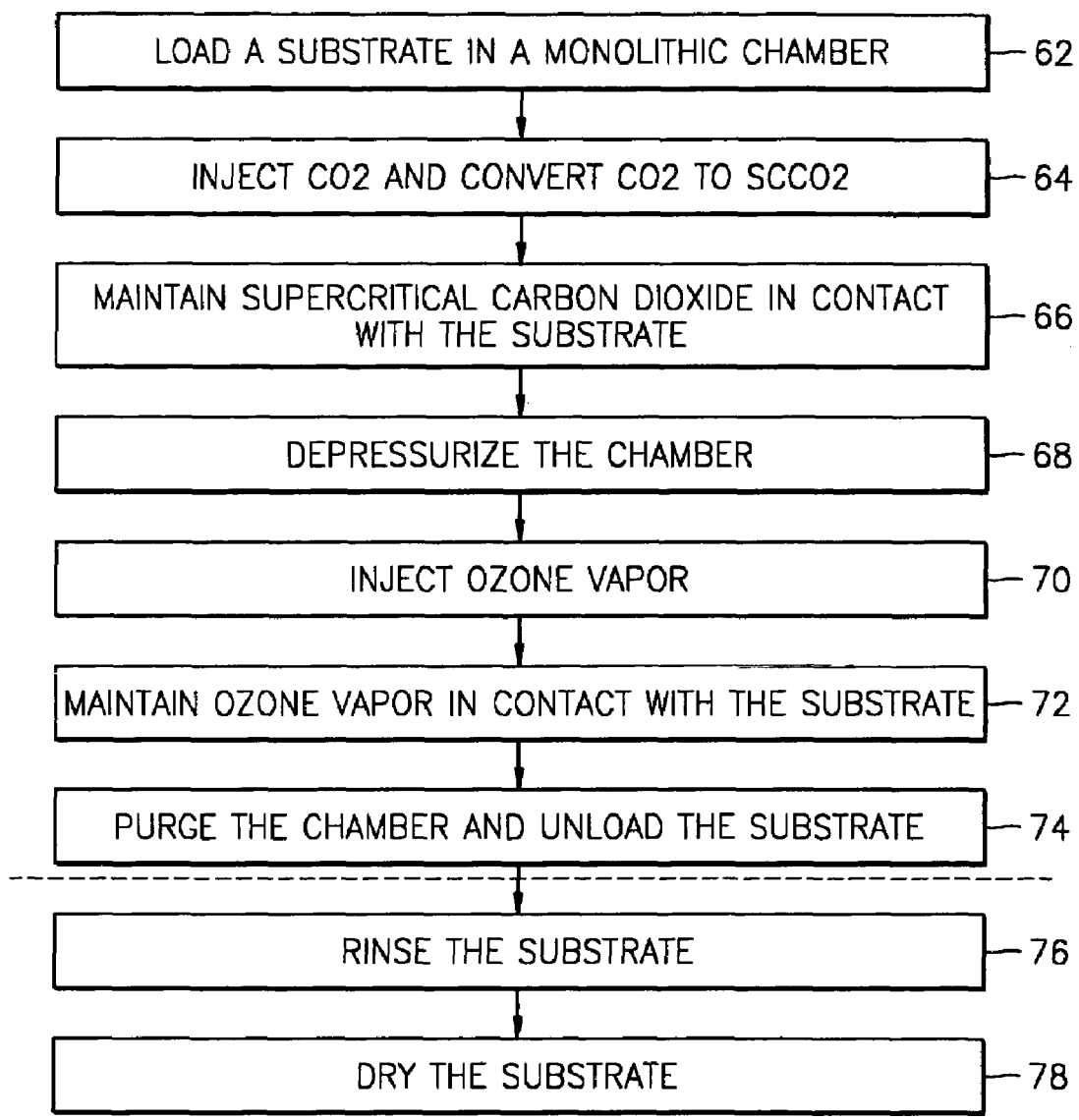
FIG. 9A illustrates a flow chart of an exemplary embodiment of the present invention taking place in a monolithic chamber and FIG. 9B illustrates the corresponding pressure versus time plot.
Figure 9B:
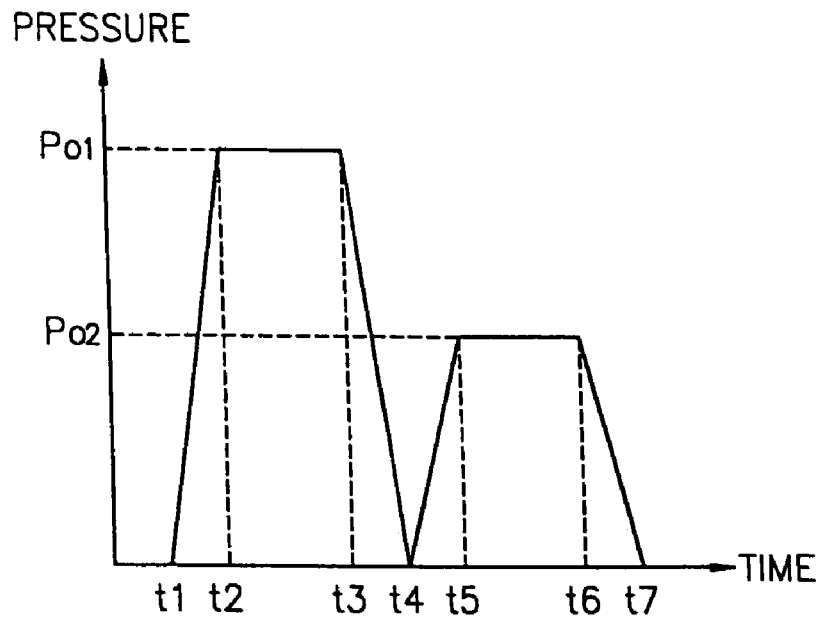

FIG. 9A illustrates a flow chart of an exemplary embodiment of the present invention taking place in a monolithic chamber and FIG. 9B illustrates the corresponding pressure versus time plot.

As shown in FIG. 9A, in step 62, the substrate 110 is loaded into the monolithic chamber. In step 64, $CO_2$ is injected into the monolithic chamber and converted to $SCCO_2$. At step 66, the $SCCO_2$ is maintained in contact with the substrate 110. At step 68, the monolithic chamber is depressurized and at step 70, ozone vapor is injected. At step 72, the ozone vapor is maintained in contact with the substrate 110 and in step 74, the monolithic chamber is purged and the substrate 110 is unloaded. Subsequently, as indicated in step 76 and 78, the substrate 110 may be rinsed and dried outside the monolithic chamber.

Figure 10:
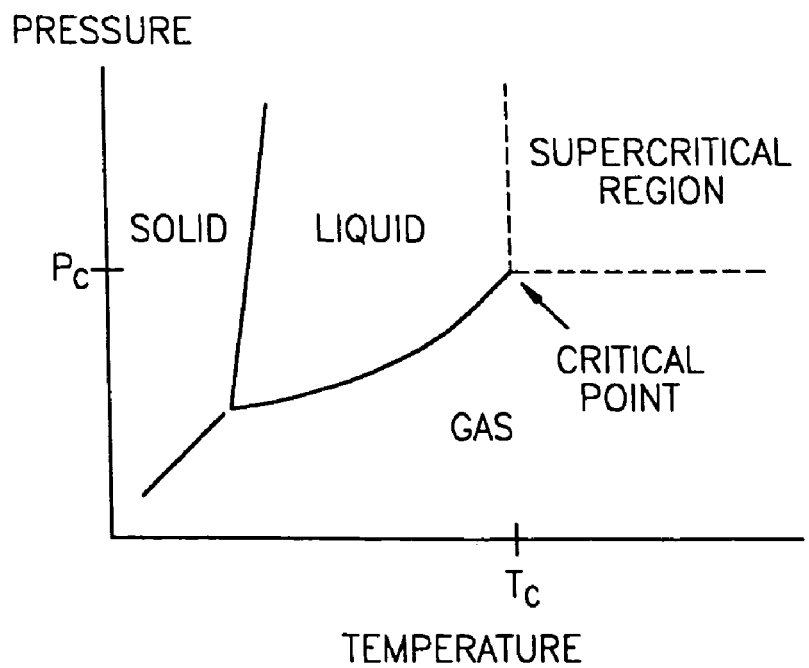
FIG. 10 illustrates a phase diagram for $CO_2$, illustrating the pressure versus temperature region at which $CO_2$ becomes supercritical.

FIG. 10 illustrates a phase diagram for $CO_2$, illustrating the pressure versus temperature region at which $CO_2$ becomes supercritical.

Figure 11:
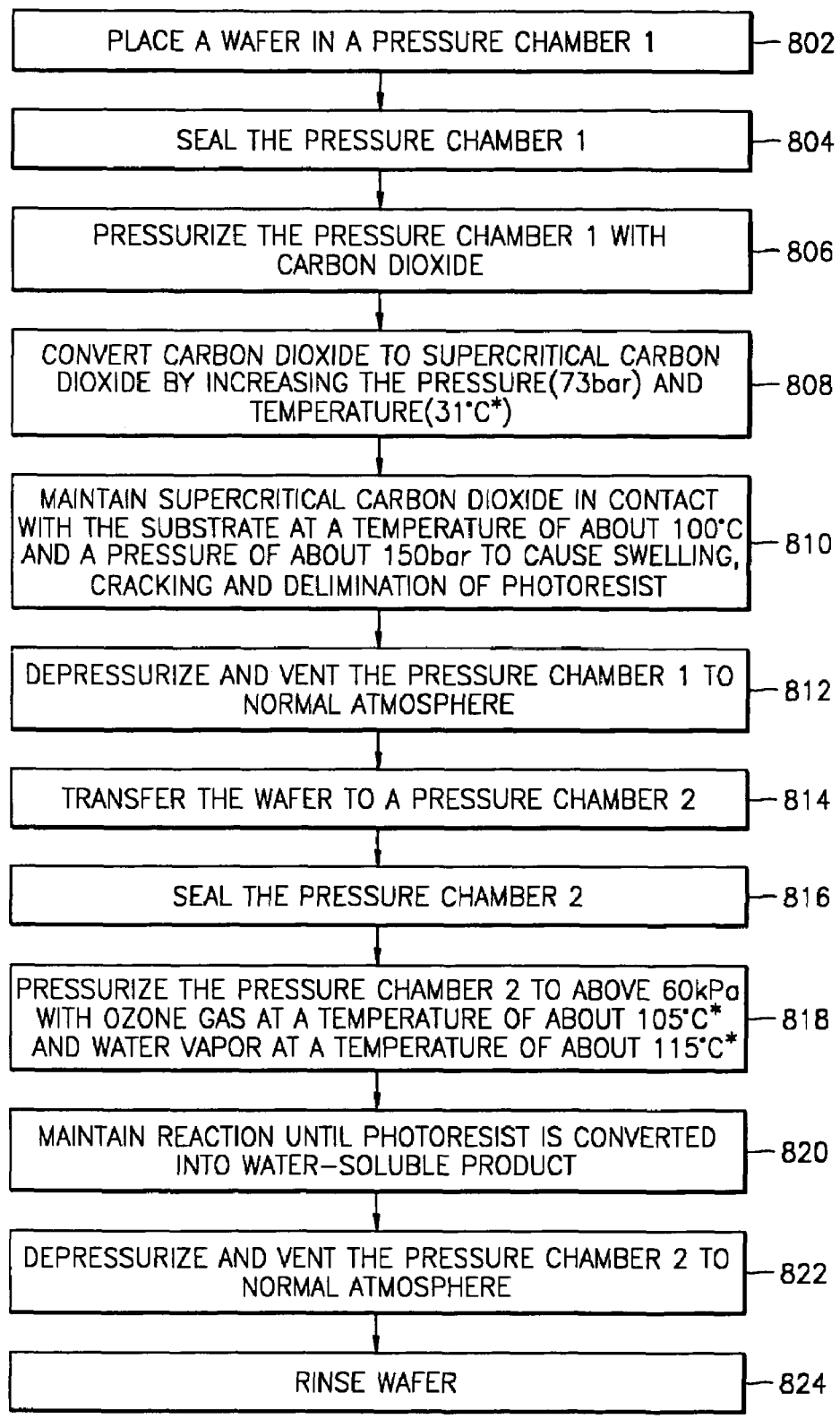
FIG. 11 illustrates a method of the present invention in accordance with another exemplary embodiment.

FIG. 11 illustrates a method of the present invention in accordance with another exemplary embodiment. As illustrated at step 802, a substrate 110 is placed in the pressure chamber. At step 804, the pressure chamber is sealed. At step 806, the pressure chamber is pressurized with $CO_2$ and at step 808, the $CO_2$ is converted to $SCCO_2$ by increasing the pressure and temperature. For $CO_2$ to become critical, the pressure must be above 73 bar and the temperature above 31° C., as illustrated in FIG. 10. At step 810, the $SCCO_2$ is maintained in contact with the substrate 110. Step 810 causes swelling, cracking and/or delamination of the photoresist on the substrate 110. In an exemplary embodiment, the temperature is maintained about 100° C. and the pressure is maintained about 150 bar. At step 812, the chamber is depressurized to normal atmospheric pressure and vented. At step 814, the substrate 110 is transferred to a second pressure chamber and at step 816 that pressure chamber is sealed. At step 818, the second pressure chamber is pressurized to elevated pressure. In an exemplary embodiment, the pressure is above 60 kPa.

Further, at step 818, ozone gas and water vapor are provided at elevated temperature. In an exemplary embodiment, the ozone gas is provided at a temperature of about 105° C. and water vapor is provided at a temperature of about 115° C. At step 820, the reaction is maintained until the photoresist is converted into a water-soluble product and at step 822, the second chamber is depressurized to normal atmosphere and vented. At step 824, the substrate is rinsed and the water-soluble product removed.

An exemplary embodiment of the method of the present invention includes three steps. The first step is a treatment with a first reactant, to cause swelling, cracking, or delamination of a photoresist, the second step is treatment with a second reactant to chemically alter the photoresist, and the third step is removing the chemically altered photoresist with a third reactant. In an exemplary embodiment, the first reactant is $SCCO_2$, the second reactant is an ozone-based reactant, and the third reactant is deionized water. In other exemplary embodiments, the ozone-based reactant is ozone vapor, in another exemplary embodiment, highly concentrated ozone vapor. In other exemplary embodiments, the ozone vapor has a concentration equal to or greater than 90,000 ppm. In other exemplary embodiments, the ozone-based reactant is ozone gas mixed with water vapor Another exemplary embodiment of the method of the present invention includes three steps. The first step is a treatment with $SCCO_2$, the second step is treatment with an ozone-based reactant, and the third step is a rinsing step. For each of these three steps, exemplary process conditions may be maintained. With respect to the $SCCO_2$ treatment step, the temperature within the chamber may be maintained between 100 and 150° C. and the pressure between 150 and 200 bars. With respect to the highly saturated ozone vapor treatment statement, the temperature of the chamber may be maintained at 105° C. and the temperature of the vapor at 115° C. In an exemplary embodiment, a temperature gap between the chamber and the vapor is in the range of about 10° C. to 15° C. and a pressure gap is between 60 kPa and 80 kPa. It is noted that a pressure higher than 80 kPa may be maintained, as long as proper safety precautions are observed. With respect to the concentration of the ozone gas, in an exemplary embodiment, the concentration is 90,000 ppm or greater at the ozone generator.

It is noted that the arrangement of the apparatuses illustrated in FIGS. 5-7 is exemplary, and could be modified, to add, replace, or delete elements, as would be known to one of ordinary skill in the art. It is further noted that the methods illustrated in FIGS. 8A, 9A, and 11 are also exemplary, and various steps could be added, replaced, or deleted, as would also be known to one of ordinary skill in the art.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method of removing photoresist from a substrate, comprising:
   treating the photoresist with a supercritical first reactant to cause swelling, cracking or delamination of the photoresist;
   subsequently treating the photoresist with a second reactant consisting of a chemical not containing the supercritical first reactant to chemically alter the photoresist; and
   subsequently removing the chemically altered photoresist with a third reactant.

2. The method of claim 1, wherein the photoresist is formed by ion implantation.

3. The method of claim 2, wherein the ion implantation was performed at a dose of $3 \times 10^{15}$ ions/cm$^2$ or higher.

4. The method of claim 1, wherein the supercritical first reactant is supercritical carbon dioxide ($SCCO_2$).

5. The method of claim 4, wherein the supercritical carbon dioxide ($SCCO_2$) is at a temperature of 100-150° C. and a pressure of 150-200 bar.

6. The method of claim 1, wherein the second reactant is an ozone-based reactant.

7. The method of claim 6, wherein the ozone-based reactant is ozone vapor.

8. The method of claim 6, wherein the ozone-based reactant is ozone gas mixed with water vapor.

9. The method of claim 7, wherein the ozone vapor is at a temperature of 105-115° C. and a pressure of 60-80 kPa.

10. The method of claim 7, wherein the ozone vapor is at a concentration of 90,000 ppm or greater.

11. The method of claim 1, wherein the chemically altered photoresist is removed by rinsing.

12. The method of claim 1, wherein the third reactant is deionized water.

13. The method of claim 1, wherein the photoresist is normal photoresist.

14. The method of claim 1, wherein the photoresist is a photoresist damaged by etching.

15. The method of claim 1, wherein the photoresist includes at least one of organic residue and organic contaminants.

16. A method of removing photoresist, from a substrate, comprising:
   treating the photoresist with supercritical carbon dioxide ($SCCO_2$);
   subsequently treating the photoresist with an ozone-based reactant consisting of a chemical not containing supercritical carbon dioxide ($SCCO_2$); and
   subsequently removing the photoresist with deionized water.

17. The method of claim 16, wherein the supercritical carbon dioxide ($SCCO_2$) is at a temperature of 100-150° C. and a pressure of 150-200 bar.

18. The method of claim 16, wherein the ozone-based reactant is ozone vapor at a temperature of 105-115° C. and a pressure of 60-80 kPa.

19. A method of removing photoresist from a substrate, comprising:
   loading the substrate into a chamber;
   injecting a first reactant into the chamber and converting the first reactant to supercritical condition;
   maintaining contact between the substrate and the supercritical first reactant;
   depressurizing the chamber after the maintaining of contact between the substrate and the supercritical first reactant;
   injecting a second reactant into the depressurized chamber;
   maintaining contact between the substrate and the second reactant;
   purging the chamber and unloading the substrate;
   removing the photoresist; and
   drying the substrate;
   wherein injecting the first reactant and injecting the second reactant are performed sequentially.

20. The method of claim 19, further comprising:
   before injecting the second reactant, loading the substrate into a second chamber, wherein said maintaining and purging occur in the second chamber.

21. The method of claim 19, wherein the first reactant is supercritical carbon dioxide ($SCCO_2$).

22. The method of claim 21, wherein the supercritical carbon dioxide ($SCCO_2$) is at a temperature of 100-150° C. and a pressure of 150-200 bar.

23. The method of claim 19, wherein the second reactant is an ozone-based reactant.

24. The method of claim 23, wherein the ozone-based reactant is ozone vapor.

25. The method of claim 23, wherein there is a 10-15° difference between the second chamber and the ozone-based reactant.

26. The method of claim 25, wherein the second chamber is at a temperature of 105° C. and the ozone-based reactant is at a temperature of 115° C. and a pressure of 60-80 kPa.

27. The method of claim 23, wherein the ozone-based reactant is at a concentration of 90,000 ppm.

28. The method of claim 19, wherein the rinse is a deionized water rinse.

29. The method of claim 21, wherein the supercritical carbon dioxide ($SCCO_2$) causes swelling, cracking or delamination of the photoresist.

30. The method of claim 24, wherein the ozone vapor alters the photoresist into a water soluble product.

31. The method of claim 1, wherein the supercritical first reactant is supercritical carbon dioxide ($SCCO_2$) and the second reactant is an ozone-based reactant.

32. The method of claim 19, wherein the photoresist is treated with the first reactant, then treated with the second reactant.

33. The method of claim 32, wherein the first reactant is supercritical carbon dioxide ($SCCO_2$) and the second reactant is an ozone-based reactant.

34. The method of claim 33, wherein the photoresist is treated with the second reactant and then is removed with the third reactant.

35. The method of claim 34, wherein the third reactant is deionized water.

36. The method of claim 19, wherein the second reactant does not contain the supercritical first reactant.

* * * * *